(12) United States Patent
Carroll

(10) Patent No.: US 10,868,077 B2
(45) Date of Patent: Dec. 15, 2020

(54) THERMOELECTRIC APPARATUS AND APPLICATIONS THEREOF

(75) Inventor: David L Carroll, Winston Salem, NC (US)

(73) Assignee: Wake Forest University, Winston-Salem, NC (US)

(*) Notice: Subject to any disclaimer, the term of this patent is extended or adjusted under 35 U.S.C. 154(b) by 0 days.

(21) Appl. No.: 13/880,268

(22) PCT Filed: Oct. 18, 2011

(86) PCT No.: PCT/US2011/056740
§ 371 (c)(1),
(2), (4) Date: Aug. 7, 2013

(87) PCT Pub. No.: WO2012/054504
PCT Pub. Date: Apr. 26, 2012

(65) Prior Publication Data
US 2013/0312806 A1    Nov. 28, 2013

Related U.S. Application Data

(60) Provisional application No. 61/394,293, filed on Oct. 18, 2010.

(51) Int. Cl.
*H01L 35/32* (2006.01)
*H01L 35/22* (2006.01)
(Continued)

(52) U.S. Cl.
CPC .............. *H01L 27/16* (2013.01); *B82Y 30/00* (2013.01); *H01L 35/14* (2013.01); *H01L 35/22* (2013.01);
(Continued)

(58) Field of Classification Search
CPC .......... H01L 35/00; H01L 35/02; H01L 35/04; H01L 35/12; H01L 35/22; H01L 35/24; H01L 35/26; H01L 35/34
See application file for complete search history.

(56) References Cited

U.S. PATENT DOCUMENTS 4,149,025 A * 4/1979 Niculescu .................... 136/206
2002/0158342 A1 10/2002 Tuominen et al.
(Continued)

FOREIGN PATENT DOCUMENTS

EP          2400574 A1    12/2011
JP          60-260166 A   12/1985
(Continued)

OTHER PUBLICATIONS

Choi et al. ("Effect of the carbon nanotube type on the thermoelectric properties of CNT/Nafion nanocomposites"); Organic Electronics 12 (2011) 2120-2125; availble online Sep. 13, 2011.*
(Continued)

*Primary Examiner* — Christina Chern
(74) *Attorney, Agent, or Firm* — J. Clinton Wimbish; Nexsen Pruet, PLLC

(57) ABSTRACT

In some embodiments, thermoelectric apparatus and various applications of thermoelectric apparatus are described herein. In some embodiments, a thermoelectric apparatus described herein comprises at least one p-type layer coupled to at least one n-type layer to provide a pn junction, and an insulating layer at least partially disposed between the p-type layer and the n-type layer, the p-type layer comprising a plurality of carbon nanoparticles and the n-type layer comprising a plurality of n-doped carbon nanoparticles.

29 Claims, 5 Drawing Sheets

(51) Int. Cl.
| | |
|---|---|
| H01L 27/16 | (2006.01) |
| B82Y 30/00 | (2011.01) |
| H01L 35/26 | (2006.01) |
| H02S 10/10 | (2014.01) |
| H01L 35/14 | (2006.01) |

(52) U.S. Cl.
CPC .............. *H01L 35/26* (2013.01); *H01L 35/32* (2013.01); *H02S 10/10* (2014.12)

(56) References Cited

U.S. PATENT DOCUMENTS

| | | | |
|---|---|---|---|
| 2004/0031515 A1* | 2/2004 | Sadatomi et al. ............ | 136/239 |
| 2004/0238022 A1* | 12/2004 | Hiller .................... | H01L 29/155 136/203 |
| 2005/0205125 A1 | 9/2005 | Nersessian et al. | |
| 2005/0231893 A1* | 10/2005 | Harvey .................. | H01G 9/155 361/502 |
| 2006/0048809 A1* | 3/2006 | Onvural ................. | B82Y 10/00 136/212 |
| 2006/0102224 A1 | 5/2006 | Chen et al. | |
| 2009/0044848 A1 | 2/2009 | Lashmore et al. | |
| 2009/0142581 A1* | 6/2009 | Heintz ................... | B82Y 30/00 428/323 |
| 2010/0116308 A1 | 5/2010 | Hayashi et al. | |
| 2010/0219383 A1 | 9/2010 | Eklund | |
| 2010/0231046 A1 | 9/2010 | Doraisamy | |
| 2010/0263701 A1* | 10/2010 | Yazawa .................. | H01L 23/38 136/203 |
| 2010/0319750 A1* | 12/2010 | Meng et al. ................. | 136/239 |
| 2012/0133210 A1 | 5/2012 | Moon et al. | |
| 2012/0133247 A1 | 5/2012 | Lee et al. | |

FOREIGN PATENT DOCUMENTS

| | | | |
|---|---|---|---|
| JP | S60260166 A | 12/1985 | |
| JP | 4199755 A | 7/1992 | |
| JP | 2002136160 A | 5/2002 | |
| JP | 2006058497 A | 3/2006 | |
| JP | 2007088039 A | 4/2007 | |
| JP | 2008130801 A | 6/2008 | |
| JP | 2009124030 A | 6/2009 | |
| JP | 2010176124 A | 8/2010 | |
| JP | 2010176124 A | 9/2010 | |
| JP | 2010199276 A | 9/2010 | |
| KR | 10-2008-0073314 A | 8/2008 | |
| WO | 2005098981 A1 | 10/2005 | |
| WO | 2009023776 A1 | 2/2009 | |
| WO | 2009150690 A1 | 12/2009 | |
| WO | 2012054504 A2 | 4/2012 | |

OTHER PUBLICATIONS

Definition of "thermocouple" retrieved from https://en.wikipedia.org/wiki/Thermocouple on Sep. 28, 2018.*
"The Seebeck Coefficient" retrieved from https://www.electronics-cooling.com/2006/11/the-seebeck-coefficient/ on Jul. 10, 2019.*
Dissertation of Martin Wagner "4.1 Characterization of Materials" retrieved from http://www.iue.tuwien.ac.at/phd/mwagner/node49.html on Jul. 10, 2019.*
"Materials for Advanced Thermoelectrics" retrieved from https://www.sigmaaldrich.com/technical-documents/articles/materials-science/metal-and-ceramic-science/thermoelectrics.html on Jul. 10, 2019.*
Definition for "layer" retrieved from https://www.dictionary.com/browse/layer on Feb. 18, 2020.*
Definition for "stratum" retrieved from https://www.dictionary.com/browse/stratumon Jun. 4, 2020.*
PCT/US2011/056740 International Search Report and Written Opinion dated Nov. 19, 2012.
Kim et al, Improved Thermoelectric Behavior of Nanotube-Filled Polymer Composites with Poly (3,4-ethylenedioxythiophene) Poly (styrenesulfonate), ACS Nano, vol. 4, No. 1, Jan. 26, 2010, pp. 513-523.
Hewitt, Corey A. et al., Multilayered Carbon Nanotube/Polymer Composite Based Thermoelectric Fabrics, Nano Letters, vol. 12, No. 3, Mar. 14, 2012, pp. 1307-1310.
Levi, Nicole et al., Properties of Polyvinylidene Difluoride-Carbon Nanotube Blends, Nano Letters, American Chemical Society, US, vol. 4, No. 7, Jun. 16, 2004, pp. 1267-1271.
Gomes, J. et al., Influence of the β-phase content and degree of crystallinity of the piezo- and ferroelctric properties of poly(vinylidene fluoride), Smart Materials and Structures, IOP Publishing Ltd., Bristol GB, vol. 19, No. 6, Apr. 30, 2010, 7 pages.
International Search Report and Written Opinion dated Oct. 24, 2014 for PCT/US2014/027486, 17 pages.
Notification Concerning Transmittal of International Preliminary Report on Patentability for corresponding PCT Application No. PCT/US2014/027486, dated Sep. 24, 2015, 13 pages.
Zhong et al., "Synthesis of high nitrogen doping of carbon nanotubes and modeling the stabilization of filled DAATO@CNTs (10,10) for nanoenergetic materils," Journal of Physics and Chemistry of Solids 71 (2010) 134-139.
Kenney & Roth, "Room Temperature Poling of Poly(vinylidene Fluoride) with Deposited Metal Electrodes," Journal of Research of the National Bureau of Standards, vol. 84, No. 6, Nov.-Dec. 1979.
V. Corral-Flores and D. Bueno-Baques (2011), Flexible Ferroelectric BaTiO3—PVDF Nanocomposites, Ferroelectrics— Material Aspects, Dr. Lallart (Ed.), ISBN: 978-953-307-332-2, in Tech, Avalable from: http://www.intechopen.com/books/ferroelectrics-material-aspects/flexible-ferroelectric-batio3-pvdfnanocomposites.
Park et al., "Piezoelectric BaTiO3 Thin Nanogenerator on Plastic Substrates," Nano Lett., 2010, 10 (12), pp. 4939-4943.
JP 2013-535009 Office Action dated Sep. 6, 2016, 15 pages.
JP 2013-535009 Office Action dated Oct. 20, 2015, 11 pages.
Australian Examination Report dated Aug. 15, 2014, Application No. 2011317206, 3 pages.
Canadian Office Action dated Jul. 29, 2014, Application No. 2,814,993, 2 pages.
Canadian Office Action dated Jul. 22, 2015, Application No. 2,814,093, 2 pages.
Chinese First Office Action dated Jul. 17, 2015, Application No. 2011800588751, 17 pages.
Chinese Second Office Action dated Feb. 1, 2016, Application No. 2011800588751, 3 pages.
Chinese Third Office Action dated Aug. 1, 2016, Application No. 2011800588751, 3 pages.
European Examination Report dated Jul. 28, 2014, Application No. 11776294.8, 5 pages.
Choi, Yongjoon et al., Effect of the Carbon Nanotube Type on the Thermoelectric Properties of CNT/Nafion Nanocomposites, Organic Electronics 12 (2011), pp. 2120-2125.
Office Action for Korean Patent Application No. 10-2013-7012643, dated May 25, 2018.

* cited by examiner

US 10,868,077 B2

THERMOELECTRIC APPARATUS AND APPLICATIONS THEREOF

RELATED APPLICATION DATA

This application claims priority under 35 U.S.C. § 119(e) from U.S. Provisional Patent Application Ser. No. 61/394,293, filed on Oct. 18, 2010, the entirety of which is hereby incorporated by reference.

FIELD

The present invention relates to thermoelectric materials and, in particular, to apparatus incorporating thermoelectric materials.

BACKGROUND OF THE INVENTION

Heat energy is widely used in the generation of electricity. However, the efficiency of converting heat energy into electrical energy by current methods is low, ranging from about 30 to 40 percent. As a result, a significant amount of heat energy escapes into the environment as waste. It is estimated that about 15 terawatts of power is lost to the environment in the annual global production of electricity.

Thermoelectric materials are operable to capture heat for additional electrical production. Thermoelectric efficiency is quantified by the Figure of Merit, ZT.

Thermoelectric materials demonstrating higher ZT values have higher thermoelectric efficiencies. Fabricating thermoelectric materials with reasonable ZT values is often difficult and/or expensive. Bismuth chalcogenides, for example, provide excellent thermoelectric properties with ZT values ranging from 0.7 to 1.0. These materials can be nanostructured to produce a superlattice structure of alternating $Bi_2Te_3$ and $Bi_2Se_3$ layers resulting in a material having acceptable electrical conductivity and poor thermal conductivity. Fabrication of these materials, nevertheless, can be time consuming and expensive.

Moreover, as a result of fabrication requirements and other material tolerances, many thermoelectric materials do not lend themselves to facile incorporation into a wide variety of devices for heat collection and electrical generation.

SUMMARY

In one aspect, thermoelectric apparatus are described herein which, in some embodiments, can overcome or mitigate one or more disadvantages of current thermoelectric materials. In some embodiments, a thermoelectric apparatus described herein comprises at least one p-type layer coupled to at least one n-type layer to provide a pn junction, and an insulating layer at least partially disposed between the p-type layer and the n-type layer, the p-type layer comprising a plurality of carbon nanoparticles and the n-type layer comprising a plurality of n-doped carbon nanoparticles. In some embodiments, carbon nanoparticles of the p-type layer are p-doped.

In some embodiments, a thermoelectric apparatus described herein comprises a plurality of p-type layers coupled to a plurality of n-type layers providing a plurality of pn junctions, and insulating layers at least partially disposed between the p-type layers and the n-type layers, wherein at least one p-type layer comprises a plurality of carbon nanoparticles and at least one n-type layer comprises a plurality of n-doped carbon nanoparticles.

In some embodiments, a p-type layer of a thermoelectric apparatus described herein further comprises a polymer matrix in which the carbon nanoparticles are disposed. In some embodiments, an n-type layer further comprises a polymer matrix in which the n-doped carbon nanoparticles are disposed. In some embodiments, p-type layers and n-type layers of a thermoelectric apparatus described herein are in a stacked configuration.

In some embodiments of a thermoelectric apparatus described herein, carbon nanoparticles including p-doped and n-doped carbon nanotubes can be substituted with one or more inorganic semiconductor nanoparticles. In some embodiments, inorganic semiconductor nanoparticles comprise group IV materials, group II/VI materials or group III/V materials or combinations thereof. In some embodiments, inorganic semiconductor nanoparticles comprise quantum dots and/or nanowires. In some embodiments, inorganic semiconductor nanoparticles have dimensions consistent with any of the carbon nanoparticles described herein.

In another aspect, a photo-thermal apparatus is described herein comprising a photovoltaic component and a thermoelectric component, the thermoelectric component comprising at least one p-type layer coupled to at least one n-type layer to provide a pn junction, and an insulating layer at least partially disposed between the p-type layer and the n-type layer, the p-type layer comprising a plurality of carbon nanoparticles and the n-type layer comprises a plurality of n-doped carbon nanoparticles. In some embodiments, the thermoelectric component comprises a plurality of p-type layers coupled to a plurality of n-type layers providing a plurality of pn junctions, and insulating layers at least partially disposed between the p-type layers and the n-type layers.

In some embodiments, a photo-thermal apparatus further comprises a Stokes shift layer positioned between the photovoltaic component and the thermoelectric component. In some embodiments, the Stokes shift layer comprises one or more Stokes shift chemical species operable to create heat energy for transmission to the adjacent side of the thermoelectric component. In some embodiments, Stokes shift chemical species absorb electromagnetic radiation that has passed through the photovoltaic component.

Moreover, in some embodiments, radiation emitted by one or more Stokes shift chemical species is absorbed by the photovoltaic component.

In another aspect, methods of making a thermoelectric apparatus are described herein. In some embodiments, a method of making a thermoelectric apparatus comprises providing at least one p-type layer comprising a plurality of carbon nanoparticles, providing at least one n-type layer comprising a plurality of n-doped carbon nanoparticles, positioning an insulating layer between the p-type layer and the n-type layer, and coupling the p-type layer and the n-type layer to provide a pn junction. In some embodiments, a plurality of p-type layers and n-type layers are provided and coupled to one another resulting in the formation of a plurality of pn junctions. In some embodiments insulating layers are positioned between the p-type layers and the n-type layers. Additionally, in some embodiments of methods of making a thermoelectric apparatus, the p-type layers and the n-type layers are arranged in a stacked configuration.

In another aspect, methods of making a photo-thermal apparatus are described herein. In some embodiments, a method of making a photo-thermal apparatus comprises providing a photovoltaic component, providing a thermoelectric component and coupling the photovoltaic component and the thermoelectric component, the thermoelectric component comprising at least one p-type layer coupled to at least one n-type layer to provide a pn junction, and an insulating layer at least partially disposed between the p-type layer and the n-type layer, the p-type layer comprising a plurality of carbon nanoparticles and the n-type layer comprising a plurality of n-doped carbon nanoparticles. In some embodiments, the thermoelectric component comprises a plurality of p-type layers coupled to a plurality of n-type layers to provide a plurality of pn junctions as described herein.

In some embodiments, a method of making a photo-thermal apparatus further comprises disposing a Stokes shift layer between the photovoltaic component and the thermoelectric component.

In another aspect, a method of converting electromagnetic energy into electrical energy is described herein. In some embodiments, a method of converting electromagnetic energy into electrical energy comprises providing an apparatus comprising a photovoltaic component and a thermoelectric component coupled to the photovoltaic component, the thermoelectric component comprising at least one p-type layer coupled to at least one n-type layer to provide a pn junction, and an insulating layer at least partially disposed between the p-type layer and the n-type layer, the p-type layer comprising a plurality of carbon nanoparticles and the n-type layer comprising a plurality of n-doped carbon nanoparticles, absorbing electromagnetic radiation with the photovoltaic component to provide a photocurrent, and heating one side of the thermoelectric component inducing a voltage across the thermoelectric component.

In some embodiments, heating one side of the thermoelectric component comprises transferring heat generated in the photovoltaic component to one side of the thermoelectric component. Additionally, in some embodiments, heating one side of the thermoelectric component comprises providing a Stokes shift layer between the photovoltaic component and the thermoelectric component, absorbing electromagnetic radiation with the Stokes shift layer to generate heat and electromagnetic radiation and transferring the generated heat to one side of the thermoelectric component. In some embodiments, the electromagnetic radiation generated by the Stokes shift layer is transmitted to the photovoltaic component for the generation of photocurrent.

These and other embodiments are described in greater detail in the detailed description which follows.

DETAILED DESCRIPTION

Embodiments described herein can be understood more readily by reference to the following detailed description, example, and drawings. Elements, apparatus, and methods described herein, however, are not limited to the specific embodiments presented in the detailed description, example, and drawings. It should be recognized that these embodiments are merely illustrative of the principles of the present invention. Numerous modifications and adaptations will be readily apparent to those of skill in the art without departing from the spirit and scope of the invention.

In addition, all ranges disclosed herein are to be understood to encompass any and all subranges subsumed therein. For example, a stated range of "1.0 to 10.0" should be considered to include any and all subranges beginning with a minimum value of 1.0 or more and ending with a maximum value of 10.0 or less, e.g., 1.0 to 5.3, or 4.7 to 10.0, or 3.6 to 7.9.

In some embodiments, a thermoelectric apparatus is described herein, the thermoelectric apparatus comprising at least one p-type layer coupled to at least one n-type layer to provide a pn junction, and an insulating layer at least partially disposed between the p-type layer and the n-type layer, the p-type layer comprising a plurality of carbon nanoparticles and the n-type layer comprising a plurality of n-doped carbon nanoparticles. In some embodiments, carbon nanoparticles of the p-type layer are p-doped.

In some embodiments, a thermoelectric apparatus described herein comprises a plurality of p-type layers coupled to a plurality of n-type layers providing a plurality of pn junctions, and insulating layers at least partially disposed between the p-type layers and the n-type layers, wherein at least one p-type layer comprises a plurality of carbon nanoparticles and at least one n-type layer comprises a plurality of n-doped carbon nanoparticles. In some embodiments, metal contacts are provided between the p-type layers and the n-type layers at the sites of pn junctions. In some embodiments, for example, a p-type layer is coupled to an n-type layer by a metal contact to provide a pn junction of the thermoelectric apparatus described herein.

In some embodiments, a p-type layer of a thermoelectric apparatus described herein further comprises a polymer matrix in which the carbon nanoparticles are disposed. In some embodiments, an n-type layer further comprises a polymer matrix in which the n-doped carbon nanoparticles are disposed. In some embodiments, p-type layers and n-type layers of a thermoelectric apparatus described herein are in a stacked configuration.

Figure 1:
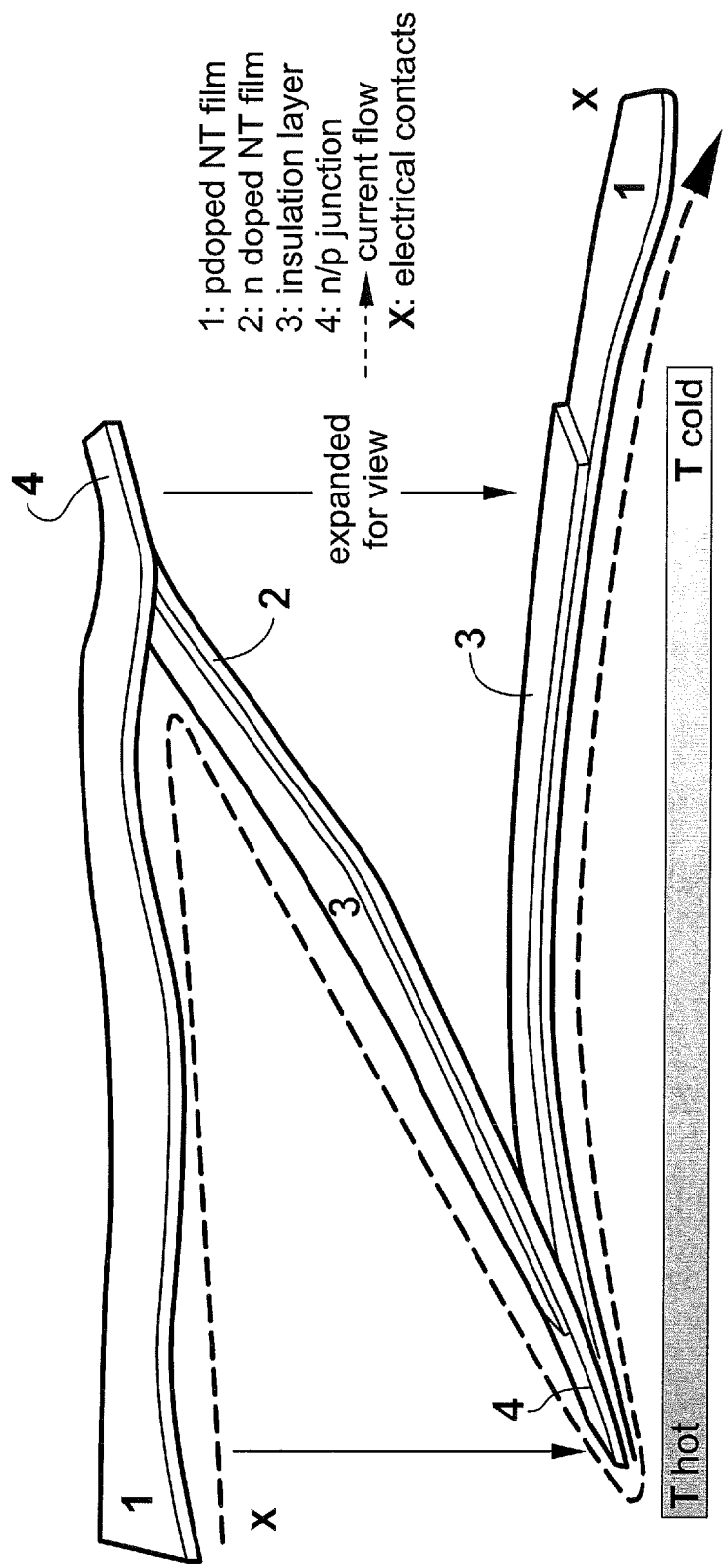
FIG. 1 illustrates a side expanded view of a thermoelectric apparatus according to one embodiment described herein.

FIG. 1 illustrates an expanded side view of a thermoelectric apparatus according to one embodiment described herein. The thermoelectric apparatus illustrated in FIG. 1 comprises two p-type layers (1) coupled to an n-type layer (2) in an alternating fashion. The alternating coupling of p-type (1) and n-type (2) layers provides the thermoelectric apparatus a z-type configuration having pn junctions (4) on opposite sides of the apparatus. Insulating layers (3) are disposed between interfaces of the p-type layers (1) and the n-type layer (2) as the p-type (1) and n-type (2) layers are in a stacked configuration. As described herein, the thermoelectric apparatus provided in FIG. 1 is in an expanded state to facilitate illustration and understanding of the various components of the apparatus. In some embodiments, however, the thermoelectric apparatus is not in an expanded state such that the insulating layers (3) are in contact with a p-type layer (1) and an n-type layer (2).

FIG. 1 additionally illustrates the current flow through the thermoelectric apparatus induced by exposing one side of the apparatus to a heat source. Electrical contacts (X) are provided to the thermoelectric apparatus for application of the thermally generated current to an external load.

Figure 2:
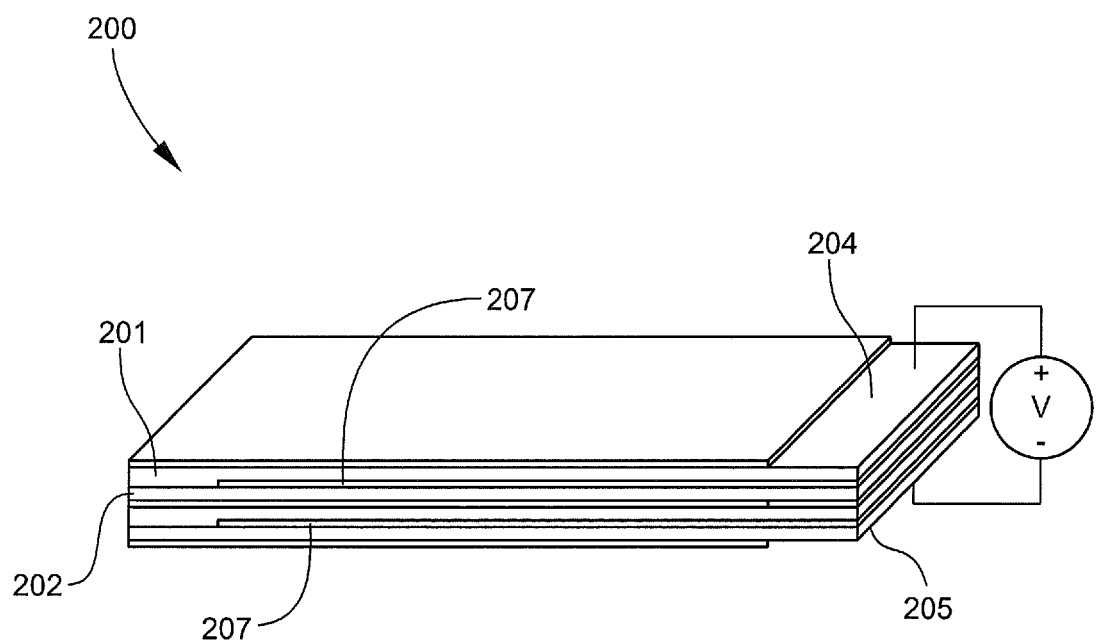
FIG. 2 illustrates a thermoelectric apparatus according to one embodiment described herein.

FIG. 2 illustrates a thermoelectric apparatus (200) according to one embodiment described herein wherein the p-type layers (201) and the n-type layers (202) are in a stacked configuration. The p-type layers (201) and the n-type layers (202) are separated by insulating layers (207) in the stacked configuration. The thermoelectric apparatus (200) is connected to an external load by electrical contacts (204, 205).

Turning now to components that can be included in the various embodiments of a thermoelectric apparatus described herein, a thermoelectric apparatus described herein comprises at least one p-type layer comprising a plurality of carbon nanoparticles.

Carbon nanoparticles of a p-type layer, in some embodiments, comprise fullerenes, carbon nanotubes, or mixtures thereof. Fullerenes, in some embodiments, comprise 1-(3-methoxycarbonyl)propyl-1-phenyl(6,6)$C_{61}$ (PCBM). In some embodiments, carbon nanotubes comprise single-walled carbon nanotubes (SWNT), multi-walled carbon nanotubes (MWNT), as well as p-doped single-walled carbon nanotubes, p-doped multi-walled carbon nanotubes or mixtures thereof.

In some embodiments, p-doped single-walled carbon nanotubes and/or p-doped multi-walled carbon nanotubes comprise boron in an amount ranging from about 0.1 weight percent to about 30 weight percent. In some embodiments, p-doped single-walled carbon nanotubes and/or p-doped multi-walled carbon nanotubes comprise boron in an amount ranging from about 5 weight percent to about 25 weight percent or from about 10 weight percent to about 20 weight percent. In some embodiments, p-doped single-walled carbon nanotubes and/or p-doped multi-walled carbon nanotubes comprise boron in an amount less than about 0.1 weight percent. In some embodiments, p-doped single-walled carbon nanotubes and/or p-doped multi-walled carbon nanotubes comprise oxygen.

In some embodiments, a p-type dopant is incorporated in the lattice of single-walled and/or multi-walled carbon nanotubes. In some embodiments, a p-type dopant is externally provided to carbon nanotubes by the environment surrounding the single walled and/or multi-walled carbon nanotubes. As described further herein, carbon nanotubes of a p-type layer, in some embodiments, are disposed in a polymeric matrix. In some embodiments, the polymeric matrix can provide p-dopant to surfaces of the carbon nanotubes. In some embodiments, wherein the polymeric matrix provides p-dopant to surfaces of the carbon nanotubes, the carbon nanotubes are not p-doped prior to incorporation into the polymeric matrix. Alternatively, in some embodiments wherein the polymeric matrix provides p-dopant to surfaces of the carbon nanotubes, the carbon nanotubes comprise p-dopant prior to incorporation into the polymeric matrix. Moreover, in some embodiments, chemical species also disposed in the polymeric matrix, such as alkali metals, can serve as p-dopant for the carbon nanotubes.

In some embodiments, carbon nanoparticles of a p-type layer have a high aspect ratio. The term aspect ratio, as used herein, refers to a carbon nanoparticle's length divided by the carbon nanoparticle's diameter or width. In some embodiments, carbon nanoparticles of a p-type layer demonstrate an aspect ratio ranging from about 1 to about $10^6$. In some embodiments, carbon nanoparticles display an aspect ratio ranging from about 10 to about 100,000. In some embodiments, carbon nanoparticles have an aspect ratio ranging from about 10 to about 10,000 or from about 5 to about 1000.

Carbon nanoparticles of a p-type layer, including carbon nanotubes, in some embodiments, have a length ranging from about 1 nm to about 5 mm or from about 10 nm to about 1 mm. In some embodiments, carbon nanoparticles have a length ranging from about 50 nm to about 500 μm, from about 100 nm to about 100 μm, or from about 500 nm to about 10 μm. In some embodiments, carbon nanoparticles have a length ranging from about 200 μm to about 500 μm.

Carbon nanoparticles of a p-type layer, in some embodiments, have a diameter ranging from about 1 nm to about 100 nm. In some embodiments, carbon nanoparticles have a diameter ranging from about 10 nm to about 80 nm or from about 20 nm to about 60 nm. In some embodiments, carbon nanoparticles have a diameter greater than about 100 nm or less than about 1 nm.

In some embodiments, carbon nanoparticles of a p-type layer, including carbon nanotubes, are provided in a mat configuration.

A p-type layer, in some embodiments, comprises one or more species of carbon nanoparticles described herein in an amount ranging from about 0.1 weight percent to about 100 weight percent. In some embodiments, a p-type layer comprises carbon nanoparticles in an amount of at least about 2 weight percent. In some embodiments, a p-type layer comprises carbon nanoparticles in an amount of at least about 5 weight percent or at least about 10 weight percent. In some embodiments, a p-type layer comprises carbon nanoparticles in an amount ranging from about 2 weight percent to about 50 weight percent. In some embodiments, a p-type layer comprises carbon nanoparticles in an amount ranging from about 5 weight percent to about 30 weight percent.

Figure 3:
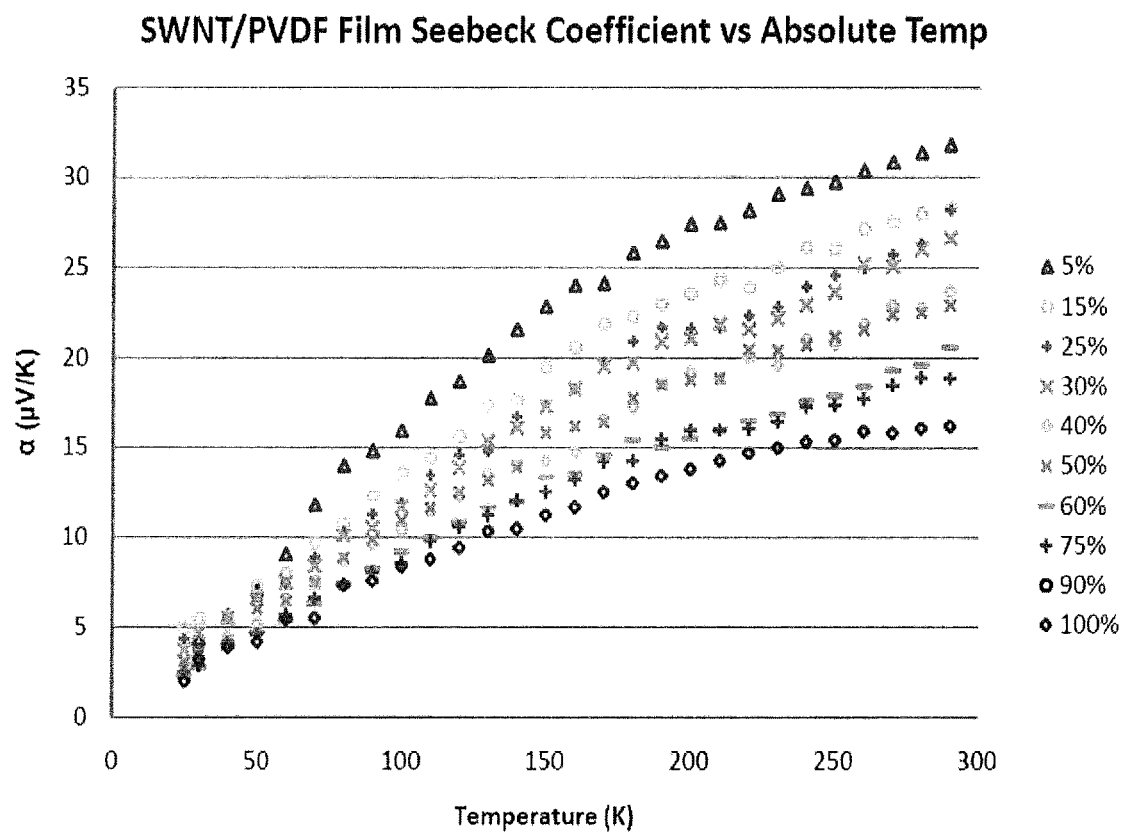
FIG. 3 illustrates Seebeck coefficient values for various carbon nanotube loadings in a polymeric matrix according to some embodiments described herein.

Carbon nanoparticle loadings of p-type layers descried herein, in some embodiments, can be chosen with reference to the desired Seebeck coefficient of the layer. FIG. 3 illustrates Seebeck coefficient as a function of SWNT loading of a polyvinylidene fluoride (PVDF) matrix of p-type layers according to some embodiments described herein. As illustrated in FIG. 3, SWNT loadings ranging from 5 weight percent to 100 weight percent provide a range of Seebeck coefficients for the p-type layers.

As described herein, in some embodiments, a p-type layer further comprises a polymeric matrix in which the carbon nanoparticles are disposed. Any polymeric material not inconsistent with the objectives of the present invention can be used in the production of a polymeric matrix. In some embodiments, a polymeric matrix comprises a fluoropolymer including, but not limited to, polyvinyl fluoride (PVF), polyvinylidene fluoride (PVDF), polytetrafluoroethylene (PTFE), or mixtures or copolymers thereof. In some embodiments, a polymer matrix comprises polyacrylic acid (PAA), polymethacrylate (PMA), polymethylmethacrylate (PMMA) or mixtures or copolymers thereof. In some embodiments, a polymer matrix comprises a polyolefin including, but not limited to polyethylene, polypropylene, polybutylene or mixtures or copolymers thereof.

In some embodiments, a polymeric matrix comprises one or more conjugated polymers. In some embodiments, conjugated polymers comprise thiophenes including poly(3-hexylthiophene) (P3HT), poly(3-octylthiophene) (P3OT), and polythiophene (PTh).

In some embodiments, a polymeric matrix comprises one or more semiconducting polymers. In some embodiments, semiconducting polymers include phenylene vinylenes, such as poly(phenylene vinylene) and poly(p-phenylene vinylene) (PPV), and derivatives thereof. In some embodiments, semiconducting polymers can comprise poly fluorenes, naphthalenes, and derivatives thereof. In some embodiments, semiconducting polymers comprise poly(2-vinylpyridine) (P2VP), polyamides, poly(N-vinylcarbazole)

(PVCZ), polypyrrole (PPy), and polyaniline (PAn). In some embodiments, a semiconducting polymer comprises poly[2,6-(4,4-bis-(2-ethylhexyl)-4H-cyclopenta[2,1-b;3,4-b']dithiophene)-alt-4,7-(2,1,3-benzothiadiazole)](PCPDTBT).

In some embodiments, a p-type layer can have any desired thickness not inconsistent with the objectives of the present invention. In some embodiments, a p-type layer has a thickness of at least about 10 nm or at least about 100 nm. A p-type layer, in some embodiments, has a thickness of at least about 500 nm or at least about 1 μm. In some embodiments a p-type layer has a thickness of at least about 5 μm or at least about 15 μm. In some embodiments, a p-type layer has a thickness ranging from about 5 nm to about 50 μm. In some embodiments, a p-type layer has a thickness ranging from about 50 nm to about 30 μm. In some embodiments, a p-type layer has a thickness ranging from about 100 nm to about 20 μm. In some embodiments, a p-type layer has a thickness ranging from about 10 nm to about 100 nm.

In some embodiments, a p-type layer can have any desired length not inconsistent with the objectives of the present invention. In some embodiments, a p-type layer has a length of at least about 1 μm or at least about 10 μm. In some embodiments, a p-type layer has a length of at least about 100 μm or at least about 500 μm. A p-type layer, in some embodiments, has a length of at least about 1 mm or at least about 10 mm. In some embodiments, a p-type layer has a length ranging from about 1 μm to about 100 mm. In some embodiments, a p-type layer has a length ranging from about 10 μm to about 500 mm.

A p-type layer, in some embodiments, has a Seebeck coefficient of at least about 5 μV/K at a temperature of 290° K. In some embodiments, a p-type layer has a Seebeck coefficient of at least about 10 μV/K at a temperature of 290° K. In some embodiments, a p-type layer has a Seebeck coefficient of at least about 15 μV/K or at least about 20 μV/K at a temperature of 290° K. In some embodiments, a p-type layer has a Seebeck coefficient of at least about 30 μV/K at a temperature of 290° K. A p-type layer, in some embodiments, has a Seebeck coefficient ranging from about 5 μV/K to about 35 μV/K at a temperature of 290° K. In some embodiments, a p-type layer has Seebeck coefficient ranging from about 10 μV/K to about 30 μV/K at a temperature of 290° K.

As described herein, in some embodiments, the Seebeck coefficient of a p-type layer can be varied according to carbon nanoparticle identity and loading. In some embodiments, for example, the Seebeck coefficient of a p-type layer is inversely proportional to the single-walled carbon nanotube loading of the p-type layer.

In addition to at least one p-type layer, a thermoelectric apparatus described herein comprises at least one n-type layer comprising a plurality of n-doped carbon nanoparticles.

N-doped carbon nanoparticles, in some embodiments, comprise fullerenes, carbon nanotubes, or mixtures thereof. Fullerenes, in some embodiments, comprise 1-(3-methoxycarbonyl)propyl-1-phenyl(6,6)$C_{61}$ (PCBM). In some embodiments, n-doped carbon nanotubes comprise single-walled carbon nanotubes, multi-walled carbon nanotubes or mixtures thereof.

In some embodiments, carbon nanoparticles of a n-type layer, including carbon nanotubes, are provided in a mat configuration.

In some embodiments, n-doped single-walled carbon nanotubes and/or n-doped multi-walled carbon nanotubes comprise nitrogen in an amount ranging from about 0.1 weight percent to about 30 weight percent. In some embodiments, n-doped single-walled carbon nanotubes and/or n-doped multi-walled carbon nanotubes comprise nitrogen in an amount ranging from about 5 weight percent to about 25 weight percent or from about 10 weight percent to about 20 weight percent. In some embodiments, n-doped single-walled carbon nanotubes and/or n-doped multi-walled carbon nanotubes comprise nitrogen in an amount less than about 0.1 weight percent. In some embodiments, n-doped single-walled carbon nanotubes and/or n-doped multi-walled carbon nanotubes are deoxygenated nanotubes.

In some embodiments, an n-type dopant is incorporated in the lattice of single-walled and/or multi-walled carbon nanotubes. In some embodiments, an n-type dopant is externally provided to carbon nanotubes by the environment surrounding the single walled and/or multi-walled carbon nanotubes. As described further herein, carbon nanotubes of an n-type layer, in some embodiments, are disposed in a polymeric matrix. In some embodiments, the polymeric matrix can provide n-dopant to surfaces of the carbon nanotubes. In some embodiments wherein the polymeric matrix provides n-dopant to surfaces of the carbon nanotubes, the carbon nanotubes are not n-doped prior to incorporation into the matrix. In some embodiments wherein the polymeric matrix provides n-dopant to surfaces of the carbon nanotubes, the carbon nanotubes are n-doped prior to incorporation into the matrix.

In some embodiments, n-doped carbon nanoparticles of an n-type layer have a high aspect ratio. In some embodiments, n-doped carbon nanoparticles of an n-type layer demonstrate an aspect ratio ranging from about 1 to about $10^6$. In some embodiments, n-doped carbon nanoparticles display an aspect ratio ranging from about 10 to about 100,000. In some embodiments, n-doped carbon nanoparticles have an aspect ratio ranging from about 10 to about 10,000 or from about 5 to about 1000.

Carbon nanoparticles of an n-type layer, including carbon nanotubes, in some embodiments, have a length ranging from about 1 nm to about 5 mm or from about 10 nm to about 1 mm. In some embodiments, n-doped carbon nanoparticles have a length ranging from about 50 nm to about 500 μm, from about 100 nm to about 100 μm, or from about 500 nm to 10 μm. In some embodiments, n-doped carbon nanotubes have a length ranging from about 200 pm to about 500 μm.

Carbon nanoparticles of an n-type layer, in some embodiments, have a diameter ranging from about 1 nm to about 100 nm. In some embodiments, n-doped carbon nanoparticles have a diameter ranging from about 10 nm to about 80 nm or from about 20 nm to about 60 nm. In some embodiments, n-doped carbon nanoparticles have a diameter greater than about 100 nm or less than about 1 nm.

A n-type layer, in some embodiments, can comprise one or more species of n-doped carbon nanoparticles described herein in an amount ranging from about 0.1 weight percent to about 100 weight percent. In some embodiments, an n-type layer comprises n-doped carbon nanoparticles in an amount of at least about 2 weight percent. In some embodiments, an n-type layer comprises n-doped carbon nanoparticles in an amount of at least about 5 weight percent or at least about 10 weight percent. In some embodiments, an n-type layer comprises n-doped carbon nanoparticles in an amount ranging from about 2 weight percent to about 50 weight percent. In some embodiments, an n-type layer comprises n-doped carbon nanoparticles in an amount ranging from about 5 weight percent to about 30 weight percent. As with the p-type layer, nanoparticle loadings of an n-type layer, in some embodiments, can be determined with reference to the desired Seebeck coefficient of the layer.

As described herein, in some embodiments, an n-type layer further comprises a polymeric matrix in which the n-doped carbon nanoparticles are disposed. Any polymeric material not inconsistent with the objectives of the present invention can be used in the production of a polymeric matrix for receiving n-doped carbon nanoparticles. In some embodiments, a polymeric matrix comprises a fluoropolymer including, but not limited to, polyvinyl fluoride (PVF), polyvinylidene fluoride (PVDF), polytetrafluoroethylene (PTFE), or mixtures or copolymers thereof. In some embodiments, a polymer matrix comprises polyacrylic acid (PAA), polymethacrylate (PMA), polymethylmethacrylate (PMMA) or mixtures or copolymers thereof. In some embodiments, a polymer matrix comprises a polyolefin including, but not limited to polyethylene, polypropylene, polybutylene or mixtures or copolymers thereof.

In some embodiments, a polymeric matrix of an n-type layer comprises one or more conjugated polymers. In some embodiments, conjugated polymers comprise thiophenes including poly(3-hexylthiophene) (P3HT), poly(3-octylthiophene) (P3OT), and polythiophene (PTh).

In some embodiments, a polymeric matrix of an n-type layer comprises one or more semiconducting polymers. In some embodiments, semiconducting polymers include phenylene vinylenes, such as poly(phenylene vinylene) and poly(p-phenylene vinylene) (PPV), and derivatives thereof. In other embodiments, semiconducting polymers can comprise poly fluorenes, naphthalenes, and derivatives thereof. In some embodiments, semiconducting polymers comprise poly(2-vinylpyridine) (P2VP), polyamides, poly(N-vinylcarbazole) (PVCZ), polypyrrole (PPy), and polyaniline (PAn).

In some embodiments, an n-type layer can have any desired thickness not inconsistent with the objectives of the present invention. In some embodiments, an n-type layer has a thickness of at least about 1 nm. In some embodiments, an n-type layer has a thickness of at least about 10 nm or at least about 100 nm. An n-type layer, in some embodiments, has a thickness of at least about 500 nm or at least about 1 µm. In some embodiments an n-type layer has a thickness of at least about 5 µm or at least about 15 µm. In some embodiments, an n-type layer has a thickness ranging from about 5 nm to about 50 µm. In some embodiments, an n-type layer has a thickness ranging from about 50 nm to about 30 µm. In some embodiments, an n-type layer has a thickness ranging from about 100 nm to about 20 µm.

In some embodiments, an n-type layer can have any desired length not inconsistent with the objectives of the present invention. In some embodiments, an n-type layer has a length of at least about 1 µm or at least about 10 µm. In some embodiments, an n-type layer has a length of at least about 100 µm or at least about 500 µm. An n-type layer, in some embodiments, has a length of at least about 1 mm or at least about 10 mm. In some embodiments, an n-type layer has a length ranging from about 1 µm to about 100 mm. In some embodiments, an n-type layer has a length ranging from about 10 µm to about 500 mm. In some embodiments, an n-type layer has a length coextensive or substantially coextensive with an adjacent p-type layer.

An n-type layer, in some embodiments, has a Seebeck coefficient of at least about −5 µV/K at a temperature of 290° K. In some embodiments, an n-type layer has a Seebeck coefficient at least about −10 µV/K at a temperature of 290° K. In some embodiments, an n-type layer has a Seebeck coefficient of at least about −15 µV/K or at least about −20 µV/K at a temperature of 290° K. In some embodiments, an n-type layer has a Seebeck coefficient of at least about −30 µV/K at a temperature of 290° K. An n-type layer, in some embodiments, has a Seebeck coefficient ranging from about −5 µV/K to about −35 µV/K at a temperature of 290° K. In some embodiments, an n-type layer has Seebeck coefficient ranging from about −10 µV/K to about −30 µV/K at a temperature of 290° K.

In some embodiments, the Seebeck coefficient of an n-type layer can be varied according to n-doped carbon nanoparticle identity and loading. In some embodiments, for example, the Seebeck coefficient of an n-type layer is inversely proportional to the carbon nanoparticle loading of the n-type layer.

In some embodiments of a thermoelectric apparatus described herein, carbon nanoparticles including p-doped and n-doped carbon nanotubes can be substituted with one or more inorganic semiconductor nanoparticles. In some embodiments, inorganic semiconductor nanoparticles comprise group IV materials, group II/VI materials or group III/V materials or combinations thereof. In some embodiments, inorganic semiconductor nanoparticles comprise quantum dots and/or nanowires. In some embodiments, inorganic semiconductor materials are provided with p-dopant or n-dopant for use in respective p-layers and n-layers described herein.

A thermoelectric apparatus described herein, in some embodiments, also comprises an insulating layer disposed between the at least one p-type layer and the at least one n-type layer. In some embodiments, an insulating layer is electrically insulating. In some embodiments, the insulating layer is electrically insulating and thermally insulating. In some embodiments, a thermoelectric apparatus comprises a plurality of insulating layers disposed between a plurality of p-type layers and n-type layers. Insulating layers, in some embodiments, permit p-type layers and n-type layers of a thermoelectric apparatus described herein to be arranged in a stacked configuration.

In some embodiments, an insulating layer comprises one or more polymeric materials. Any polymeric material not inconsistent with the objectives of the present invention can be used in the production of an insulating layer. In some embodiments, an insulating layer comprises polyacrylic acid (PAA), polymethacrylate (PMA), polymethylmethacrylate (PMMA) or mixtures or copolymers thereof. In some embodiments, an insulating layer comprises a polyolefin including, but not limited to polyethylene, polypropylene, polybutylene or mixtures or copolymers thereof. In some embodiments, an insulating layer comprises PVDF.

An insulating layer can have any desired thickness not inconsistent with the objectives of the present invention. In some embodiments, an insulating layer has a thickness of at least about 50 nm. In some embodiments, an insulating layer has a thickness of at least about 75 nm or at least about 100 nm. An insulating layer, in some embodiments, has a thickness of at least about 500 nm or at least about 1 µm. In some embodiments, an insulating layer has a thickness of at least about 5 µm or at least about 15 µm. In some embodiments, an insulating layer has a thickness ranging from about 5 nm to about 50 µm. In some embodiments, an insulating layer has a thickness ranging from about 50 nm to about 30 µm. In some embodiments, an insulating layer has a thickness ranging from about 100 nm to about 20 µm.

An insulating layer can have any desired length not inconsistent with the objectives of the present invention. In some embodiments, an insulating layer has a length substantially consistent with the lengths of the p-type and n-type layers between which the insulating layer is disposed. In some embodiments, an insulating layer has a length of at least about 1 μm or at least about 10 μm. In some embodiments, an insulating layer has a length of at least about 100 μm or at least about 500 μm. An insulating layer, in some embodiments, has a length of at least about 1 mm or at least about 10 μm. In some embodiments, an insulating layer has a length ranging from about 1 μm to about 100 μm. In some embodiments, an insulating layer has a length ranging from about 10 μm to about 500 mm.

A thermoelectric apparatus described herein, in some embodiments, comprises a plurality of p-type layers and a plurality of n-type layers. In some embodiments, a thermoelectric apparatus can comprise any number of p-type layers and n-type layers not inconsistent with the objectives of the present invention. In some embodiments, the p-type layers and the n-type layers are ordered in alternating fashion and in a stacked configuration, being separated by insulating layers. In some embodiments, a thermoelectric apparatus comprises at least 3 p-type layers and at least 3 n-type layers. In some embodiments, a thermoelectric apparatus comprises at least 5 p-type layers and at least 5 n-type layers. In some embodiments, a thermoelectric apparatus comprises at least 10 p-type layers and at least 10 n-type layers. In some embodiments, a thermoelectric apparatus comprises at least 15 p-type layers and at least 15 n-type layers. In some embodiments, a thermoelectric apparatus comprises at least 100 p-type layers and at least 100 n-type layers. In some embodiments, a thermoelectric apparatus comprises at least 1000 p-type layers and at least 1000 n-type layers.

In some embodiments, a thermoelectric apparatus described herein comprising one or more p-type layers and one or more n-type layers has the form of a fabric. In some embodiments, the fabric is flexible permitting application of the thermoelectric apparatus to a variety of substrates having different surface shapes and/or morphologies. In some embodiments, for example, a thermoelectric apparatus is applied to curved and/or other non-planar substrates.

In some embodiments, a thermoelectric apparatus having a construction described herein has a Seebeck coefficient of at least about 25 μV/K at a temperature of 290° K. In some embodiments, a thermoelectric apparatus described herein has a Seebeck coefficient of at least about 30 μV/K or at least about 50 μV/K at a temperature of 290° K. In some embodiments, a thermoelectric apparatus described herein has a Seebeck coefficient of at least about 75 μV/K or at least about 100 μV/K at a temperature of 290° K. A thermoelectric apparatus described herein, in some embodiments, has a Seebeck coefficient of at least about 150 μV/K or at least about 175 μV/K at a temperature of 290° K. In some embodiments, a thermoelectric apparatus described herein has a Seebeck coefficient of at least about 200 μV/K at a temperature of 290° K. In some embodiments, a thermoelectric apparatus described herein has a Seebeck coefficient ranging from about 25 μV/K to about 250 μV/K at a temperature of 290° K. In some embodiments, a thermoelectric apparatus described herein has a Seebeck coefficient ranging from about 50 μV/K to about 150 μV/K at a temperature of 290° K.

In some embodiments, a thermoelectric apparatus described herein has a ZT of at least 0.5. A thermoelectric apparatus described herein, in some embodiments, has a ZT of at least about 0.7 or at least about 0.8. In some embodiments, a thermoelectric apparatus described herein has a ZT of at least about 1 or at least about 1.5. In some embodiments, a thermoelectric apparatus described herein has a ZT ranging from about 0.5 to about 2 or from about 0.8 to about 1.5. In some embodiments, a thermoelectric apparatus described herein has a ZT ranging from about 1 to about 1.3. In some embodiments, a thermoelectric apparatus described herein has a ZT ranging from about 1 to 10.

In another aspect, a photo-thermal apparatus is described herein comprising a photovoltaic component and a thermoelectric component, the thermoelectric component comprising at least one p-type layer coupled to at least one n-type layer to provide a pn junction, and an insulating layer at least partially disposed between the p-type layer and the n-type layer, the p-type layer comprising a plurality of carbon nanoparticles and the n-type layer comprising a plurality of n-doped carbon nanoparticles. In some embodiments, the thermoelectric component comprises a plurality of p-type layers coupled to a plurality of n-type layers providing a plurality of pn junctions, and insulating layers at least partially disposed between the p-type layers and the n-type layers.

Figure 4:
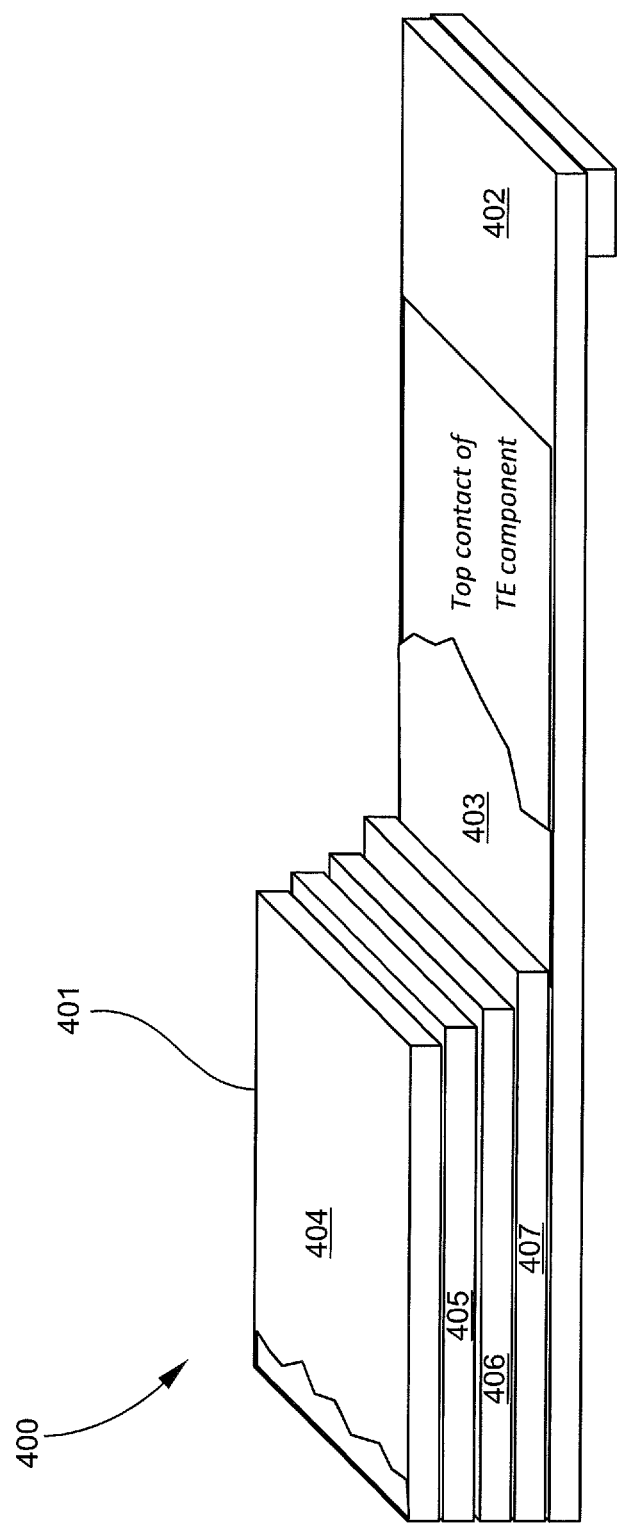
FIG. 4 illustrates a photo-thermal apparatus according to one embodiment described herein.

FIG. 4 illustrates a photo-thermal apparatus according to one embodiment described herein. The photo-thermal apparatus (400) illustrated in FIG. 4 comprises a photovoltaic component (401) coupled to a thermoelectric component (402). The thermoelectric component can comprise any construction described herein for a thermoelectric apparatus.

Moreover, the photovoltaic component comprises a radiation transmissive first electrode (404), at least one photosensitive layer (405), an exciton blocking layer (406) and a second radiation transmissive electrode (407). In some embodiments of a photo thermal apparatus, an electrode of the photovoltaic component adjacent to the thermoelectric component is non-radiation transmissive.

Radiation transmissive first electrode and second electrode, according to some embodiments described herein, comprise a radiation transmissive conducting oxide.

Radiation transmissive conducting oxides, in some embodiments, can comprise indium tin oxide (ITO), gallium indium tin oxide (GITO), and zinc indium tin oxide (ZITO). In some embodiments, radiation transmissive first and second electrodes can comprise a radiation transmissive polymeric material such as polyanaline (PANI) and its chemical relatives. In some embodiments, radiation transmissive first and second electrodes comprise ZnO:Al.

In some embodiments, 3,4-polyethylenedioxythiophene (PEDOT) can be a suitable radiation transmissive polymeric material for the first and/or second electrode. In some embodiments, a radiation transmissive first and/or second electrode can comprise a carbon nanotube layer having a thickness operable to at least partially pass visible electromagnetic radiation.

In another embodiment, a radiation transmissive first and/or second electrode can comprise a composite material, the composite material comprising a nanoparticle phase dispersed in a polymeric phase. The nanoparticle phase, in one embodiment, can comprise carbon nanotubes, fullerenes, or mixtures thereof. In a further embodiment, a radiation transmissive first and/or second electrode can comprise a metal layer having a thickness operable to at least partially pass visible electromagnetic radiation. In some embodiments, a metal layer can comprise elementally pure metals or alloys. Metals suitable for use as a radiation transmissive first electrode can comprise high work function metals.

In some embodiments, radiation transmissive first and second electrodes can have a thickness ranging from about 10 nm to about 1 μm. In some embodiments, radiation transmissive first and second electrodes can have a thickness ranging from about 100 nm to about 900 nm. In another embodiment, radiation transmissive first and second electrodes can have a thickness ranging from about 200 nm to about 800 nm. In a further embodiment, radiation transmissive first and second electrodes can have a thickness greater than about 1 μm.

In some embodiments, radiation transmissive first and second electrodes are constructed independently of one another. In some embodiments, radiation transmissive first and second electrodes are constructed with reference to one another.

In some embodiments, the at least one photosensitive layer of a photovoltaic component comprises an organic composition. In some embodiments, a photosensitive organic layer has a thickness ranging from about 30 nm to about 1 μm. In other embodiments, a photosensitive organic layer has a thickness ranging from about 80 nm to about 800 nm. In a further embodiment, a photosensitive organic layer has a thickness ranging from about 100 nm to about 300 nm.

A photosensitive organic layer, according to embodiments described herein, comprises at least one photoactive region in which electromagnetic radiation is absorbed to produce excitons which may subsequently dissociate into electrons and holes. In some embodiments, a photoactive region can comprise a polymer. Polymers suitable for use in a photoactive region of a photosensitive organic layer, in one embodiment, can comprise conjugated polymers such as thiophenes including poly(3-hexylthiophene) (P3HT), poly (3-octylthiophene) (P3OT), and polythiophene (PTh).

In some embodiments, polymers suitable for use in a photoactive region of a photosensitive organic layer can comprise semiconducting polymers. In one embodiment, semiconducting polymers include phenylene vinylenes, such as poly(phenylene vinylene) and poly(p-phenylene vinylene) (PPV), and derivatives thereof. In other embodiments, semiconducting polymers can comprise poly fluorenes, naphthalenes, and derivatives thereof. In a further embodiment, semiconducting polymers for use in a photoactive region of a photosensitive organic layer can comprise poly(2-vinylpyridine) (P2VP), polyamides, poly(N-vinylcarbazole) (PVCZ), polypyrrole (PPy), and polyaniline (PAn).

A photoactive region, according to some embodiments, can comprise small molecules. In one embodiment, small molecules suitable for use in a photoactive region of a photosensitive organic layer can comprise coumarin 6, coumarin 30, coumarin 102, coumarin 110, coumarin 153, and coumarin 480 D. In another embodiment, a small molecule can comprise merocyanine 540. In a further embodiment, small molecules can comprise 9,10-dihydrobenzo[a]pyrene-7(8H)-one, 7-methylbenzo[a]pyrene, pyrene, benzo[e]pyrene, 3,4-dihydroxy-3-cyclobutene-1,2-dione, and 1,3-bis [4-(dimethylamino)phenyl-2,4-dihydroxycyclobutenediylium dihydroxide.

In some embodiments, exciton dissociation is precipitated at heterojunctions in the organic layer formed between adjacent donor and acceptor materials. Organic layers, in some embodiments described herein, comprise at least one bulk heterojunction formed between donor and acceptor materials. In other embodiments, organic layers comprise a plurality of bulk heterojunctions formed between donor and acceptor materials.

In the context of organic materials, the terms donor and acceptor refer to the relative positions of the highest occupied molecular orbital (HOMO) and lowest unoccupied molecular orbital (LUMO) energy levels of two contacting but different organic materials. This is in contrast to the use of these terms in the inorganic context, where donor and acceptor may refer to types of dopants that may be used to create inorganic n- and p-type layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

A photoactive region in a photosensitive organic layer, according to some embodiments described herein, comprises a polymeric composite material. The polymeric composite material, in one embodiment, can comprise a nanoparticle phase dispersed in a polymeric phase. Polymers suitable for producing the polymeric phase of a photoactive region can comprise conjugated polymers such as thiophenes including poly(3-hexylthiophene) (P3HT) and poly (3-octylthiophene) (P3OT).

In some embodiments, the nanoparticle phase dispersed in the polymeric phase of a polymeric composite material comprises at least one carbon nanoparticle. Carbon nanoparticles can comprise fullerenes, carbon nanotubes, or mixtures thereof. Fullerenes suitable for use in the nanoparticle phase, in one embodiment, can comprise 1-(3-methoxycarbonyl)propyl-1-phenyl(6,6)$C_{61}$ (PCBM). Carbon nanotubes for use in the nanoparticle phase, according to some embodiments, can comprise single-walled nanotubes, multi-walled nanotubes, or mixtures thereof.

In some embodiments described herein, the polymer to nanoparticle ratio in polymeric composite materials ranges from about 1:10 to about 1:0.1. In some embodiments, the polymer to nanoparticle ratio in polymeric composite materials ranges from about 1:4 to about 1:0.4. In some embodiments, the polymer to nanoparticle ratio in polymeric composite materials ranges from about 1:2 to about 1:0.6. In one embodiment, for example, the ratio of poly(3-hexylthiophene) to PCBM ranges from about 1:1 to about 1:0.4.

In a further embodiment, the nanoparticle phase dispersed in the polymeric phase comprises at least one nanowhisker. A nanowhisker, as used herein, refers to a crystalline carbon nanoparticle formed from a plurality of carbon nanoparticles. Nanowhiskers, in some embodiments, can be produced by annealing a photosensitive organic layer comprising the polymeric composite material. Carbon nanoparticles operable to form nanowhiskers, according to some embodiments, can comprise single-walled carbon nanotubes, multi-walled carbon nanotubes, and fullerenes. In one embodiment, nanowhiskers comprise crystalline PCBM. Annealing the photosensitive organic layer, in some embodiments, can further increase the dispersion of the nanoparticle phase in the polymeric phase.

In embodiments of photoactive regions comprising a polymeric phase and a nanoparticle phase, the polymeric phase serves as a donor material and the nanoparticle phase serves as the acceptor material thereby forming a heterojunction for the separation of excitons into holes and electrons. In embodiments wherein nanoparticles are dispersed throughout the polymeric phase, the photoactive region of the organic layer comprises a plurality of bulk heterojunctions. In some embodiments, donor materials in a photoactive region of a photosensitive organic layer can comprise organometallic compounds including porphyrins, phthalocyanines, and derivatives thereof. In further embodiments, acceptor materials in a photoactive region of a photosensitive organic layer can comprise perylenes, naphthalenes, and mixtures thereof.

In some embodiments, the at least one photosensitive layer of a photovoltaic component comprises an inorganic composition. Photosensitive inorganic layers described herein, in some embodiments, can have various compositions. In some embodiments, a photosensitive inorganic layer of a photovoltaic component described herein comprises an inorganic composition comprising a group IV semiconductor material, a group II/VI semiconductor material (such as CdTe), a group III/V semiconductor material, or combinations or mixtures thereof. In some embodiments, a photosensitive inorganic layer comprises a group IV, group II/VI, or group III/V binary, ternary or quaternary system. In some embodiments, a photosensitive inorganic layer comprises a I/III/VI material, such as copper indium gallium selenide (CIGS). In some embodiments, a photosensitive inorganic layer comprises polycrystalline silicon (Si). In some embodiments, a photosensitive inorganic layer comprises microcrystalline, nanocrystalline, and/or protocrystalline silicon. In some embodiments, a photosensitive inorganic layer comprises polycrystalline copper zinc tin sulfide (CZTS). In some embodiments, a photosensitive inorganic layer comprises microcrystalline, nanocrystalline, and/or protocrystalline CZTS. In some embodiments, the CZTS comprises $Cu_2ZnSnS_4$. In some embodiments, the CZTS further comprises selenium (Se). In some embodiments, the CZTS further comprises gallium (Ga).

In some embodiments, a photosensitive inorganic layer of a photovoltaic component described herein comprises an amorphous material. In some embodiments, at least one photosensitive inorganic layer comprises amorphous silicon (a-Si). In some embodiments, amorphous silicon of a photosensitive inorganic layer is unpassivated or substantially unpassivated. In some embodiments, amorphous silicon of a photosensitive inorganic layer is passivated with hydrogen (a-Si:H). In some embodiments, amorphous silicon of a photosensitive inorganic layer is not passivated with a halogen or is non-halogen passivated. In some embodiments, for example, amorphous silicon of a photosensitive inorganic layer comprises no or substantially no Si:F. Alternatively, in some embodiments, amorphous silicon of a photosensitive inorganic layer is fluorine passivated (a-Si:F).

In some embodiments, one or more heterojunctions can be established in a photosensitive inorganic layer described herein by doping. In some embodiments, for example, one region of a photosensitive inorganic layer is doped with a p-dopant and another region of the photosensitive inorganic layer is doped with an n-dopant to provide a heterojunction. In some embodiments wherein a material of the photosensitive inorganic layer is intrinsically p-type, a region of the photosensitive inorganic layer can be doped with an n-dopant to provide a heterojunction. In some embodiments, wherein a material of the photosensitive inorganic layer is intrinsically n-type, a region of the photosensitive inorganic layer can be doped with a p-dopant to provide a heterojunction.

In some embodiments, any of the inorganic materials described herein for a photosensitive layer suitable for doping are doped to establish one or more heterojunctions in the photosensitive layer. In some embodiments, for example, hydrogen passivated amorphous silicon is doped with p-type and/or n-type dopant to establish one or more heterojunctions. Moreover, in some embodiments, group IV, group III/V and/or group II/VI semiconductor materials of inorganic photosensitive layers described herein can be doped with p-type and/or n-type dopant to provide one or more heterojunctions.

In some embodiments, a photovoltaic component described herein comprises at least one photosensitive inorganic layer comprising an n-type region, an intrinsic region, and a p-type region. In some embodiments, an n-type region is composed of an n-doped inorganic semiconductor. In some embodiments, a p-type region is composed of a p-doped inorganic semiconductor. In some embodiments, an intrinsic region is composed of an undoped inorganic semiconductor.

In some embodiments, a photovoltaic component described herein comprises a multi-junction construction. In some embodiments, a photovoltaic component comprises a plurality of photosensitive inorganic layers, each layer comprising an n-type region, an intrinsic region, and a p-type region. In some embodiments, a photovoltaic component comprises two photosensitive inorganic layers, each layer comprising an n-type region, an intrinsic region, and a p-type region, thereby providing a double junction device. In some embodiments, a photovoltaic component comprises three photosensitive inorganic layers, each layer comprising an n-type region, an intrinsic region, and a p-type region, thereby providing a triple junction device. In some embodiments comprising a plurality of photosensitive inorganic layers each comprising an n-type region, an intrinsic region, and a p-type region, the plurality of inorganic layers are adjacent to one another, such that one or more heterojunctions are formed between the inorganic layers. In some embodiments, for example, a photovoltaic component comprises a first photosensitive inorganic layer comprising a first n-type region, a first intrinsic region, and a first p-type region; and a second photosensitive inorganic layer comprising a second n-type region, a second intrinsic region, and a second p-type region, wherein the first p-type region is adjacent to the second n-type region or the first n-type region is adjacent to the second p-type region. In some embodiments, an optoelectronic device described herein comprises a single junction device. As known to one of skill in the art, tunneling junctions, in some embodiments, can be disposed between first, second and/or third photosensitive inorganic layers in the construction of a multi-junction device described herein.

In some embodiments, a photovoltaic component comprises a plurality of photosensitive organic layers.

In some embodiments wherein a plurality of photosensitive layers is present in a photovoltaic component, the absorption profiles of the photosensitive layers do not overlap or do not substantially overlap. In some embodiments wherein a plurality of photosensitive layers is present in a photovoltaic component, the absorption profiles of the photosensitive layers at least partially overlap. In some embodiments, a plurality of photosensitive layers can be used in a photovoltaic component to capture one or more regions of the solar spectrum.

In some embodiments, an exciton blocking layer (EBL) of a photovoltaic component can act to confine photogenerated excitons to the region near the dissociating interface and prevent parasitic exciton quenching at a photosensitive layer/electrode interface. In addition to limiting the path over which excitons may diffuse, an EBL can additionally act as a diffusion barrier to substances introduced during deposition of the electrodes. In some embodiments, an EBL can have a sufficient thickness to fill pin holes or shorting defects which could otherwise render a photovoltaic apparatus inoperable.

An EBL, according to some embodiments described herein, can comprise a polymeric composite material. In one embodiment, an EBL comprises carbon nanoparticles dispersed in 3,4-polyethylenedioxythiophene:polystyrenesulfonate (PEDOT:PSS). In another embodiment, an EBL comprises carbon nanoparticles dispersed in poly(vinylidene chloride) and copolymers thereof. Carbon nanoparticles dispersed in the polymeric phases including PEDOT:PSS and poly(vinylidene chloride) can comprise single-walled nanotubes, multi-walled nanotubes, fullerenes, or mixtures thereof. In further embodiments, EBLs can comprise any polymer having a work function energy operable to permit the transport of holes while impeding the passage of electrons.

In some embodiments, an EBL may be disposed between the radiation transmissive first electrode and an organic photosensitive layer of a photoactive assembly. In some embodiments wherein the optoelectronic device comprises a plurality of photosensitive organic layers, for example, EBLs can be disposed between the photosensitive organic layers.

In some embodiments, a photovoltaic component comprises one or more upconverters and/or downconverters. As understood by one of skill in the art, an upconverter is a material operable to emit electromagnetic radiation having energy greater than that of the electromagnetic radiation absorbed by the material to create the excited state. Upconverters suitable for use in some embodiments, can absorb infrared radiation and emit visible radiation at wavelengths operable to be absorbed by photosensitive organic layers of photovoltaic components described herein.

Upconverters, in some embodiments, can include materials comprising at least one Lanthanide series element. In some embodiments, upconveter materials can comprise nanoparticles comprising at least one Lanthanide series element. Lanthanide series elements suitable for use in upconverter materials according to some embodiments described herein comprise erbium, ytterbium, dysprosium, holmium, or mixtures thereof. In some embodiments, upconverter materials comprise metal oxides and metal sulfides doped with ions of erbium, ytterbium, dysprosium, holmium, or mixtures thereof. In other embodiments, optical fibers may be doped directly with ions of erbium, ytterbium, dysprosium, holmium, or mixtures thereof.

In other embodiments, upconverter materials can comprise organic chemical species. Organic upconverter materials can comprise $H_2C_6N$ and 4-dialkylamino-1,8-naphthalimides as well as 1,8-naphthalimide derivatives and compounds, such as multibranched naphthalimide derivatives TPA-NA1, TPA-NA2, and TPA-NA3. Organic upconverter materials can also comprise 4-(dimethylamino)cinnamonitrile (cis and trans), trans-4-[4-(dimethylamino)styryl]-1-methylpyridinium iodide, 4-[4-(dimethylamino)styryl]pyridine, 4-(diethylamino)benzaldehyde diphenylhydrazone, trans-4-[4-(dimethylamino)styryl]-1-methylpyridinium p-toluenesulfonate, 2-[ethyl[4-[2-(4-nitrophenyl)ethenyl]phenyl]amino]ethanol, 4-dimethylamino-4'-nitrostilbene, Disperse Orange 25, Disperse Orange 3, and Disperse Red 1.

In a further embodiment, upconverter materials can comprise quantum dots. Quantum dots, according to some embodiments, can comprise III/V and II/VI semiconductor materials, such as cadmium selenide (CdSe), cadmium telluride (CdTe), and zinc selenide (ZnSe). Upconverter materials can also comprise core-shell architectures of quantum dots.

In addition to those provided herein, some embodiments described herein contemplate additional upconverter materials comprising transition metals, such as chromium.

In some embodiments, a photovoltaic component has a construction consistent with that described in U.S. patent application Ser. Nos. 12/298,942 and 12/298,936, each of which is incorporated herein by reference in its entirety.

Referring once again to FIG. 4, the photo-thermal apparatus (400) further comprises a Stokes shift layer (403) disposed between the photovoltaic component (401) and the thermoelectric component (402). In some embodiments, the Stokes shift layer comprises one or more Stokes shift chemical species operable to create heat energy for transmission to the adjacent side of the thermoelectric component. In some embodiments, Stokes shift chemical species absorb electromagnetic radiation that has passed through the photovoltaic component (401). Moreover, in some embodiments, radiation emitted by one or more Stokes shift chemical species is absorbed by the photovoltaic component (401).

Any Stokes shift material not inconsistent with the objectives of the present invention can be used for incorporation into the Stokes shift layer. In some embodiments, suitable Stokes shift materials are selected according to absorption and emission profiles. In some embodiments, the absorption profile of a Stokes shift material does not overlap with the absorption profile of a photosensitive layer of the photovoltaic component. In some embodiments, the absorption profile of a Stokes shift material at least partially overlaps with the absorption profile of a photosensitive layer of the photovoltaic component. Additionally, in some embodiments, a Stokes shift material has an emission profile that at least partially overlaps with the absorption profile of a photosensitive layer of the photovoltaic component.

In some embodiments, a Stokes shift material is operable to absorb radiation in the near ultraviolet region of the electromagnetic spectrum. In some embodiments, for example, a Stokes shift material absorbs radiation having a wavelength ranging from about 300 nm to about 400 nm.

In some embodiments, a Stokes shift material comprises a dye. Any dye not inconsistent with the objectives of the present invention may be used. In some embodiments, for example, a dye comprises one or more of coumarins, coumarin derivatives, pyrenes, and pyrene derivatives. In some embodiments, a Stokes shift material comprises an ultraviolet light-excitable fluorophore. Non-limiting examples of dyes suitable for use in some embodiments described herein include methoxycoumarin, dansyl dyes, pyrene, Alexa Fluor 350, aminomethylcoumarin acetate (AMCA), Marina Blue dye, Dapoxyl dyes, dialkylaminocoumarin, bimane dyes, hydroxycoumarin, Cascade Blue dye, Pacific Orange dye, Alexa Fluor 405, Cascade Yellow dye, Pacific Blue dye, PyMPO, and Alexa Fluor 430.

In some embodiments, a Stokes shift material comprises a phosphor. Any phosphor not inconsistent with the objectives of the present invention may be used. In some embodiments, for example, a phosphor comprises one or more of halophosphate phosphors and triphosphors. Non-limiting examples of phosphors suitable for use in some embodiments described herein include $Ca_5(PO_4)_3(F, Cl):Sb^{3+}$, $Mn^{2+}$; $Eu:Y_2O_3$; and $Tb^{3+}$, $Ce^{3+}:LaPO_4$. In some embodiments, a phosphor comprises a phosphor particle. Phosphor particles, in some embodiments, can be suspended in a fluid.

In another aspect, methods of making a thermoelectric apparatus are described herein. In some embodiments, a method of making a thermoelectric apparatus comprises providing at least one p-type layer comprising a plurality of carbon nanoparticles, providing at least one n-type layer comprising a plurality of n-doped carbon nanoparticles, positioning an insulating layer between the p-type layer and the n type layer, and coupling the p-type layer and the n-type layer to provide a pn junction. In some embodiments, a plurality of p-type layers and n-type layers are provided and coupled to one another resulting in the formation of a plurality of pn junctions. In some embodiments insulating layers are positioned between the p-type layers and the n-type layers. Additionally, in some embodiments of methods of making a thermoelectric apparatus, the p-type layers and the n-type layers are arranged in a stacked configuration. In some embodiments, the p-layers and the n-layers are coupled by metal contacts to provide the pn junctions. In some embodiments, for example, a p-layer is coupled to an n-layer by a metal contact to provide a pn junction of a thermoelectric apparatus described herein.

In another aspect, methods of making a photo-thermal apparatus are described herein. In some embodiments, a method of making a photo-thermal apparatus comprises providing a photovoltaic component, providing a thermoelectric component and coupling the photovoltaic component and the thermoelectric component, the thermoelectric component comprising at least one p-type layer coupled to at least one n-type layer to provide a pn junction, and an insulating layer at least partially disposed between the p-type layer and the n-type layer, the p-type layer comprising a plurality of carbon nanoparticles and the n-type layer comprising a plurality of n-doped carbon nanoparticles. In some embodiments, the thermoelectric component comprises a plurality of p-type layers coupled to a plurality of n-type layers to provide a plurality of pn junctions as described herein.

In some embodiments, a method of making a photo-thermal apparatus further comprises disposing a Stokes shift layer between the photovoltaic component and the thermoelectric component.

In another aspect, methods of converting electromagnetic energy into electrical energy are described herein. In some embodiments, a method of converting electromagnetic energy into electrical energy comprises providing an apparatus comprising a photovoltaic component and a thermoelectric component coupled to the photovoltaic component, the thermoelectric component comprising at least one p type layer coupled to at least one n-type layer to provide a pn junction, and an insulating layer at least partially disposed between the p-type layer and the n-type layer, the p-type layer comprising a plurality of carbon nanoparticles and the n-type layer comprising a plurality of n-doped carbon nanoparticles, absorbing electromagnetic radiation with the photovoltaic component to provide a photocurrent, and heating one side of the thermoelectric component inducing a voltage across the thermoelectric component.

In some embodiments, heating one side of the thermoelectric component comprises transferring heat generated in the photovoltaic component to one side of the thermoelectric component. Additionally, in some embodiments, heating one side of the thermoelectric component comprises providing a Stokes shift layer between the photovoltaic component and the thermoelectric component, absorbing electromagnetic radiation with the Stokes shift layer to generate heat and electromagnetic radiation and transferring the generated heat to one side of the thermoelectric component. In some embodiments, the electromagnetic radiation generated by the Stokes shift layer is transmitted to the photovoltaic component for the generation of photocurrent.

These and other embodiments are further illustrated by the following non-limiting example.

EXAMPLE 1

Thermoelectric Apparatus

A first p-type layer was fabricated by providing 35 mg of single-walled carbon nanotubes (SWNT) to which was added 17.5 ml of dimethylacrylamide (DMA). The resulting mixture was high energy sonicated for a period of one hour. Polyvinylidene fluoride (PVDF) was added to the mixture in an amount to render the SWNT 20 weight percent of the mixture on a total solids basis. The resulting SWNT/PVDF/DMA mixture was high energy sonicated for one hour.

A glass slide having dimensions of 75 mm×45 mm was cleaned in methanol and placed on a hot plate at 90° C. The SWNT/PVDF/DMA mixture was poured evenly onto the slide and the DMA was allowed to evaporate. The dried SWNT/PVDF film was placed into an oven at 100° C. for 12 hours to anneal. The slide was subsequently removed from the oven and methanol was poured over the SWNT/PVDF film. The SWNT/PVDF film was carefully removed from the glass slide, washed in deionized water and dried.

A second p-type layer was prepared according to the foregoing procedure. Moreover, an n-type layer was prepared according to the foregoing procedure, the difference being n-doped carbon nanotubes were combined with the DMA and PVDF.

Two insulating layers were prepared according to the following procedure. 600 mg of polypropylene (PP) were added to DMA in a ratio of 0.025 ml DMA to 1 mg of polypropylene powder. The resulting mixture was sonicated until the PP powder was dissolved in the DMA. A glass slide having dimensions of 75 mm×45 mm was cleaned in methanol and placed on a hot plate at 90° C. The PP/DMA mixture was poured evenly onto the slide, and the DMA was allowed to evaporate. Methanol was poured over the resulting PP film, and the PP film was carefully removed from the glass slide.

Figure 5:
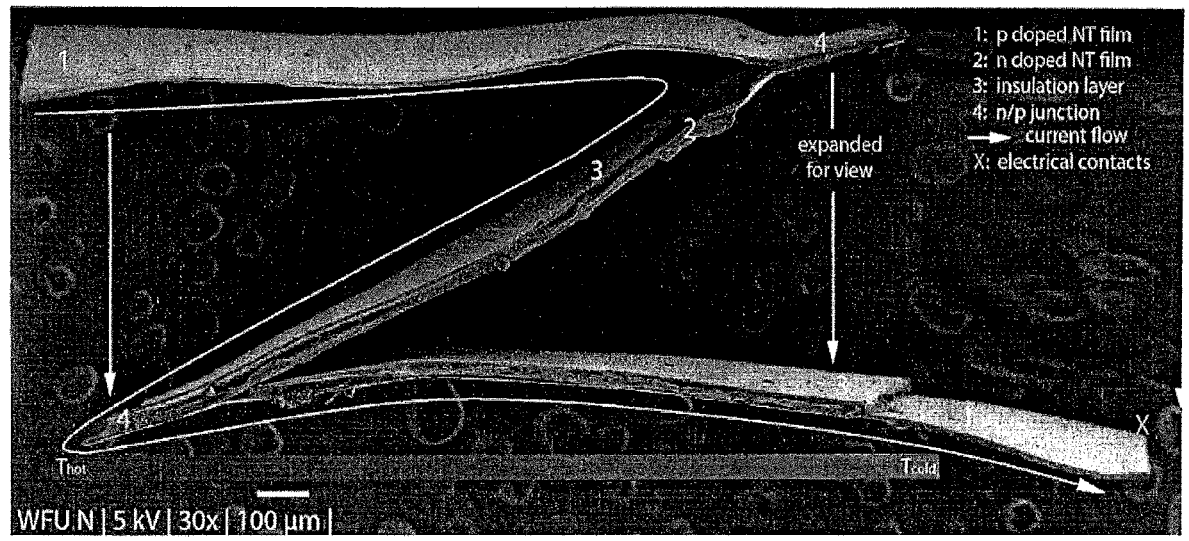
FIG. 5 illustrates a side expanded view of a thermoelectric apparatus according to one embodiment described herein.

The two p-type layers, n-type layer and the two insulating layers were subsequently coupled to provide the thermoelectric apparatus as illustrated in FIG. 5. The resulting thermoelectric apparatus was expanded in FIG. 5 for illustration of the various components of the apparatus.

Various embodiments of the invention have been described in fulfillment of the various objectives of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. A thermoelectric apparatus comprising:
    a plurality of p-type layers directly contacting a plurality of n-type layers providing a plurality of pn junctions; and
    insulating layers at least partially disposed between the p-type layers and the n-type layers, the p-type layers comprising a plurality of carbon nanoparticles and the n-type layers comprising a plurality of n-doped carbon nanoparticles,
    wherein the carbon nanoparticles of the p-type layers or the n-doped carbon nanoparticles of the n-type layers are disposed in a polymeric matrix and the apparatus has a ZT of at least 0.5.

2. The thermoelectric apparatus of claim 1, where the carbon nanoparticles of the p-type layers comprise single-walled carbon nanotubes, multi-walled carbon nanotubes, fullerenes or mixtures thereof.

3. The thermoelectric apparatus of claim 2, wherein the carbon nanoparticles of the p-type layers comprise boron.

4. The thermoelectric apparatus of claim 3, wherein the boron is present in the carbon nanoparticles in an amount ranging from about 0.1 weight percent to about 30 weight percent.

5. The thermoelectric apparatus of claim 1, wherein the n-doped carbon nanoparticles comprise single-walled carbon nanotubes, multi-walled carbon nanotubes, fullerenes or mixtures thereof.

6. The thermoelectric apparatus of claim 5, wherein the n-doped carbon nanoparticles comprise nitrogen.

7. The thermoelectric apparatus of claim 1, wherein the carbon nanoparticles of the p-type layers are disposed in a polymeric matrix and the n-doped carbon nanoparticles of the n-type layers are disposed in a polymeric matrix.

8. The thermoelectric apparatus of claim 1, wherein the carbon nanoparticles of the p-type layers are disposed in a polymeric matrix comprising a fluoropolymer.

9. The thermoelectric apparatus of claim 8, wherein the fluoropolymer comprises polyvinyl fluoride, polyvinylidene fluoride or mixtures thereof.

10. The thermoelectric apparatus of claim 1, wherein the n-doped carbon nanoparticles of the n-type layers are disposed in a polymeric matrix comprising a fluoropolymer.

11. The thermoelectric apparatus of claim 10, wherein the fluoropolymer comprises polyvinyl fluoride, polyvinylidene fluoride or mixtures thereof.

12. The thermoelectric apparatus of claim 7, wherein the polymeric matrix of the p-type layers comprises a fluoropolymer, polyacrylic, polyolefin, conjugated polymer or mixtures thereof and wherein the polymeric matrix of the n-type layers comprises a fluoropolymer, polyacrylic, polyolefin, conjugated polymer or mixtures thereof.

13. The thermoelectric apparatus of claim 12, wherein the polymeric matrix of the p-type layers comprises a fluoropolymer selected from the group consisting of polyvinyl fluoride, polyvinylidene fluoride and mixtures thereof and wherein the polymeric matrix of the n-type layers comprises a fluoropolymer selected from the group consisting of polyvinyl fluoride, polyvinylidene fluoride and mixtures thereof.

14. The thermoelectric apparatus of claim 8, wherein the carbon nanoparticles are present in the polymeric matrix in an amount ranging from about 5 weight percent to about 30 weight percent.

15. The thermoelectric apparatus of claim 8, wherein the carbon nanoparticles comprise single walled nanotubes and a Seebeck coefficient of an individual p-type layer is inversely proportional to the nanotube loading of the p-type layer.

16. The thermoelectric apparatus of claim 8, wherein an individual p-type layer has a Seebeck coefficient of at least 30 µV/K at a temperature of 290° K.

17. The thermoelectric apparatus of claim 8, wherein the p-type layers have an individual thickness of 5 nm to 50 µm.

18. The thermoelectric apparatus of claim 10, wherein an individual n-type layer has a Seebeck coefficient of −5 µV/K to −35 µV/K at a temperature of 290° K.

19. The thermoelectric apparatus of claim 10, wherein the n-type layers have an individual thickness of 5 nm to 50 µm.

20. The thermoelectric apparatus of claim 7, wherein n-dopant is provided on surfaces of the n-doped carbon nanoparticles.

21. The thermoelectric apparatus of claim 1, wherein the insulating layers comprise electrically insulating polymeric material.

22. The thermoelectric apparatus of claim 21, wherein the electrically insulating polymeric material comprises a polyolefin, polyacrylic or fluoropolymer or mixtures thereof.

23. The thermoelectric apparatus of claim 1, wherein the apparatus is flexible.

24. The thermoelectric electric apparatus of claim 1, wherein the p-type layers and n-type layers have the form of fabric.

25. The thermoelectric apparatus of claim 1, wherein the thermoelectric apparatus is flexible for application of the thermoelectric apparatus to non-planar substrates.

26. The thermoelectric apparatus of claim 25, wherein the non-planar substrates are curved.

27. The thermoelectric apparatus of claim 1 having a Seebeck coefficient of at least 25 µV/K at a temperature of 290° K.

28. The thermoelectric apparatus of claim 1 having a Seebeck coefficient from 25 µV/K to 250 µV/K at a temperature of 290° K.

29. A thermoelectric apparatus comprising:
an alternating stack of p-type layers and n-type layers, the p-type layers comprising a plurality of carbon nanoparticles and the n-type layers comprising a plurality of n-doped carbon nanoparticles, and the carbon nanoparticles of the p-type layers or the n-doped carbon nanoparticles of the n-type layers are disposed in a polymeric matrix;
a plurality of pn junctions positioned only on opposite sides of the apparatus, the pn junctions connecting the p-type layers with the n-type layers; and
insulating layers at least partially disposed between the p-type layers and the n-type layers,
wherein each n-type layer extends within a different plane than each p-type layer; and
wherein the apparatus has a ZT of at least 0.5.

* * * * *